United States Patent
Zhou et al.

(10) Patent No.: US 10,950,536 B2
(45) Date of Patent: Mar. 16, 2021

(54) PACKED INTERCONNECT STRUCTURE WITH REDUCED CROSS COUPLED NOISE

(71) Applicant: Intel Corporation, Santa Clara, CA (US)

(72) Inventors: Zhen Zhou, Chandler, AZ (US); Jun Liao, Hillsboro, OR (US); Xiang Li, Portland, OR (US); Kevin Stone, Hillsboro, OR (US); Daqiao Du, Beaverton, OR (US); Tae-Young Yang, Portland, OR (US); Ling Zheng, Chandler, AZ (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/017,710

(22) Filed: Jun. 25, 2018

(65) Prior Publication Data
US 2019/0043796 A1    Feb. 7, 2019

(51) Int. Cl.
| | |
|---|---|
| H01L 23/498 | (2006.01) |
| H01R 12/71 | (2011.01) |
| H01R 43/20 | (2006.01) |
| H01R 43/16 | (2006.01) |
| H01R 12/57 | (2011.01) |
| H01R 12/52 | (2011.01) |
| H01R 13/6467 | (2011.01) |
| H01R 12/70 | (2011.01) |

(52) U.S. Cl.
CPC .. *H01L 23/49838* (2013.01); *H01L 23/49827* (2013.01); *H01R 12/52* (2013.01); *H01R 12/57* (2013.01); *H01R 12/714* (2013.01); *H01R 13/6467* (2013.01); *H01R 43/16* (2013.01); *H01R 43/20* (2013.01); *H01R 12/707* (2013.01)

(58) Field of Classification Search
CPC ........ H01L 23/49838; H01L 23/49827; H01R 12/52; H01R 12/714; H01R 43/16; H01R 12/57; H01R 12/707
See application file for complete search history.

(56) References Cited

U.S. PATENT DOCUMENTS

| | | | | |
|---|---|---|---|---|
| 6,594,152 | B2 * | 7/2003 | Dent | H05K 1/142 361/736 |
| 7,255,573 | B2 * | 8/2007 | He | H01R 13/6461 439/66 |
| 8,587,357 | B2 * | 11/2013 | Kim | G06F 1/26 327/292 |
| 9,531,130 | B1 * | 12/2016 | Phillips | H01R 13/6471 |
| 2009/0279274 | A1 * | 11/2009 | Agnew | H05K 1/0218 361/803 |
| 2014/0374875 | A1 * | 12/2014 | Yen | H01L 28/10 257/531 |

OTHER PUBLICATIONS

Tech Web, published in Apr. 19, 2018.*

* cited by examiner

*Primary Examiner* — Hsien Ming Lee
(74) *Attorney, Agent, or Firm* — Compass IP Law PC

(57) ABSTRACT

An apparatus is described. The apparatus includes an electro-mechanical interface having angled signal interconnects, wherein, the angling of the signal interconnects is to reduce noise coupling between the angled signal interconnects.

14 Claims, 10 Drawing Sheets

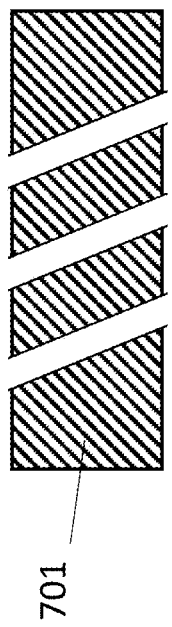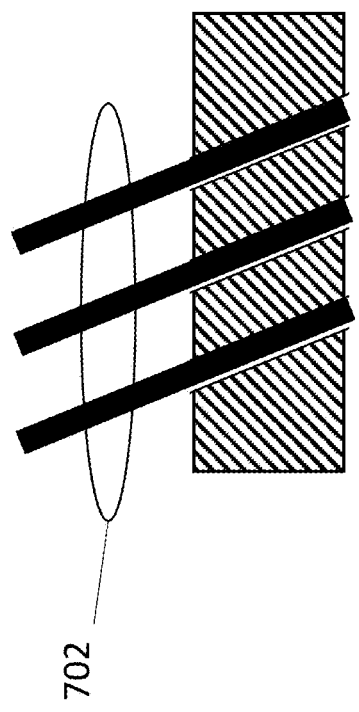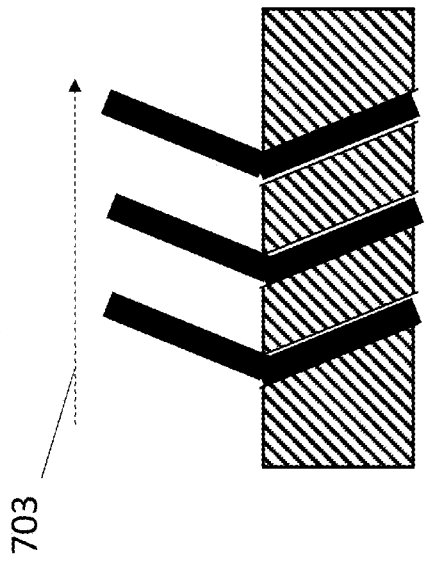
Fig. 7a
Fig. 7b
Fig. 7c

PACKED INTERCONNECT STRUCTURE WITH REDUCED CROSS COUPLED NOISE

FIELD OF INVENTION

The field of invention pertains generally to electrical engineering. More specifically, the field of invention pertains to a packed interconnect structure with reduced cross coupled nose.

BACKGROUND

As computer and other sophisticated electrical systems continue to evolve, signal interconnects need to be packed closer together and/or signal interconnects that are already packed close together need to carry higher frequency signals. Systems engineers therefore must overcome these challenges in order to build next generation computers/systems.

FIGURES

Figure 2:
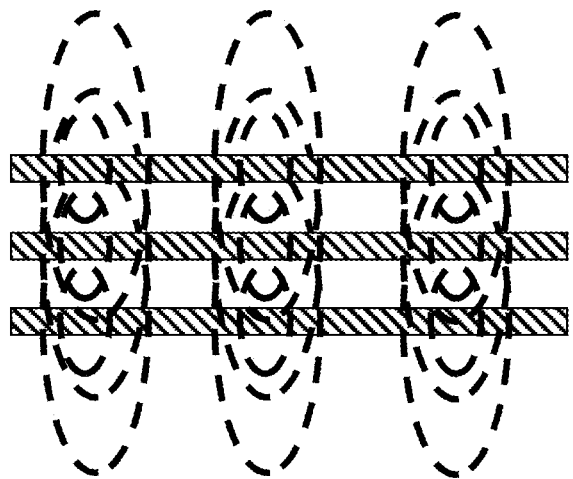
Figure 1:
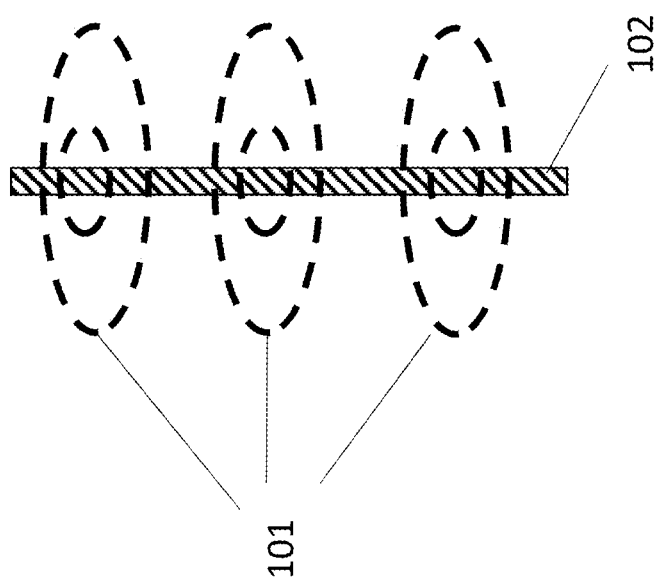
Figure 3:
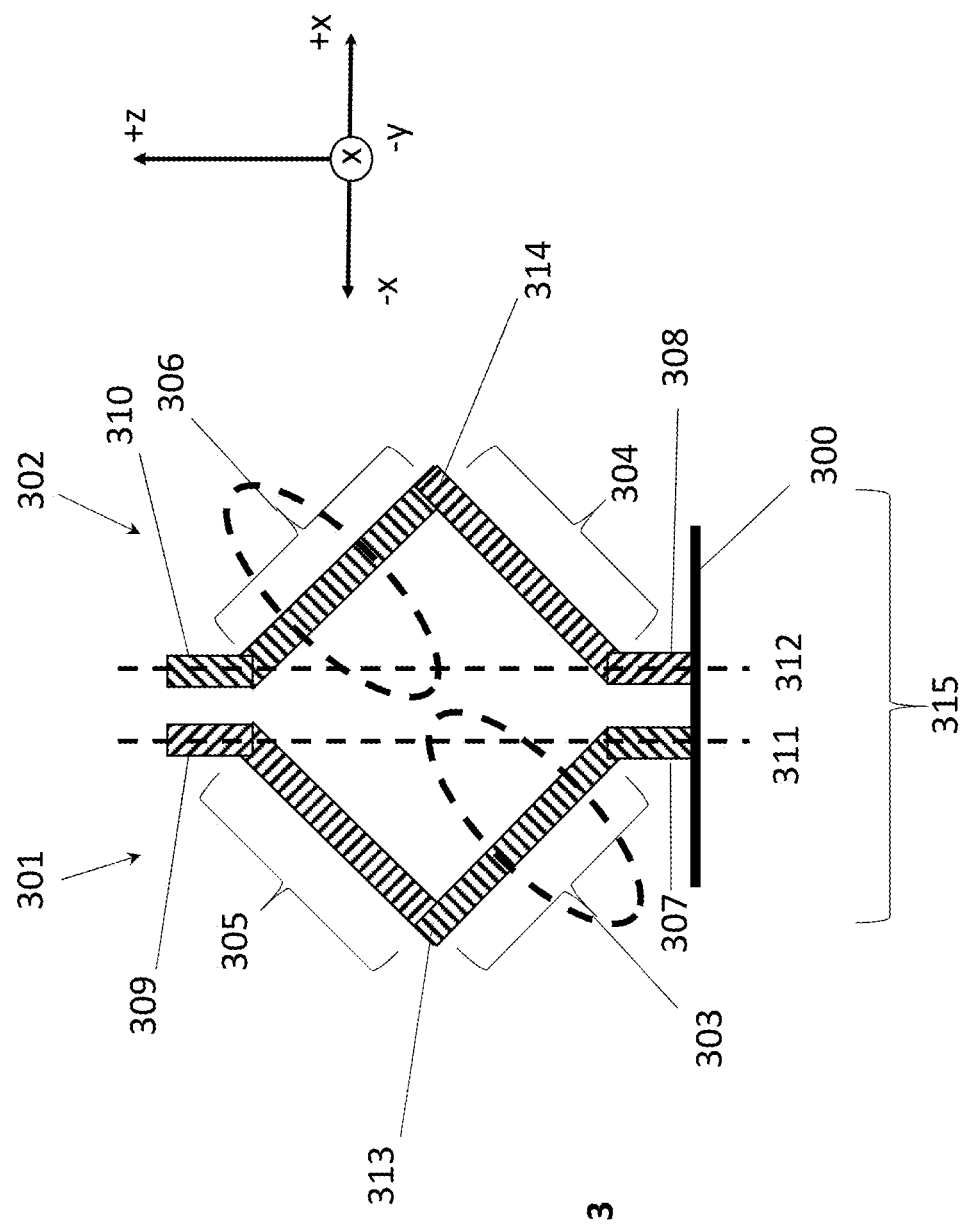
Figure 4:
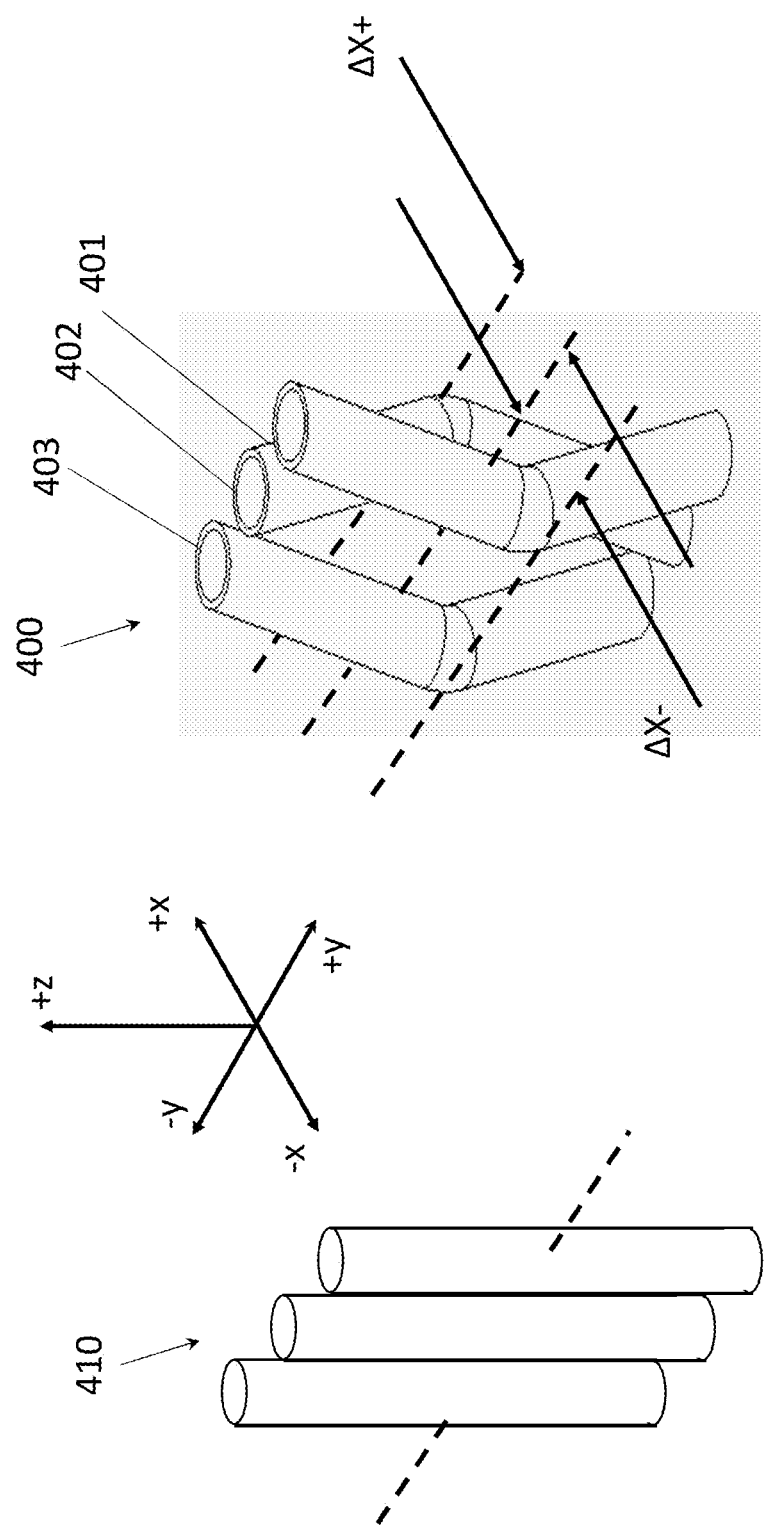
Figure 5:
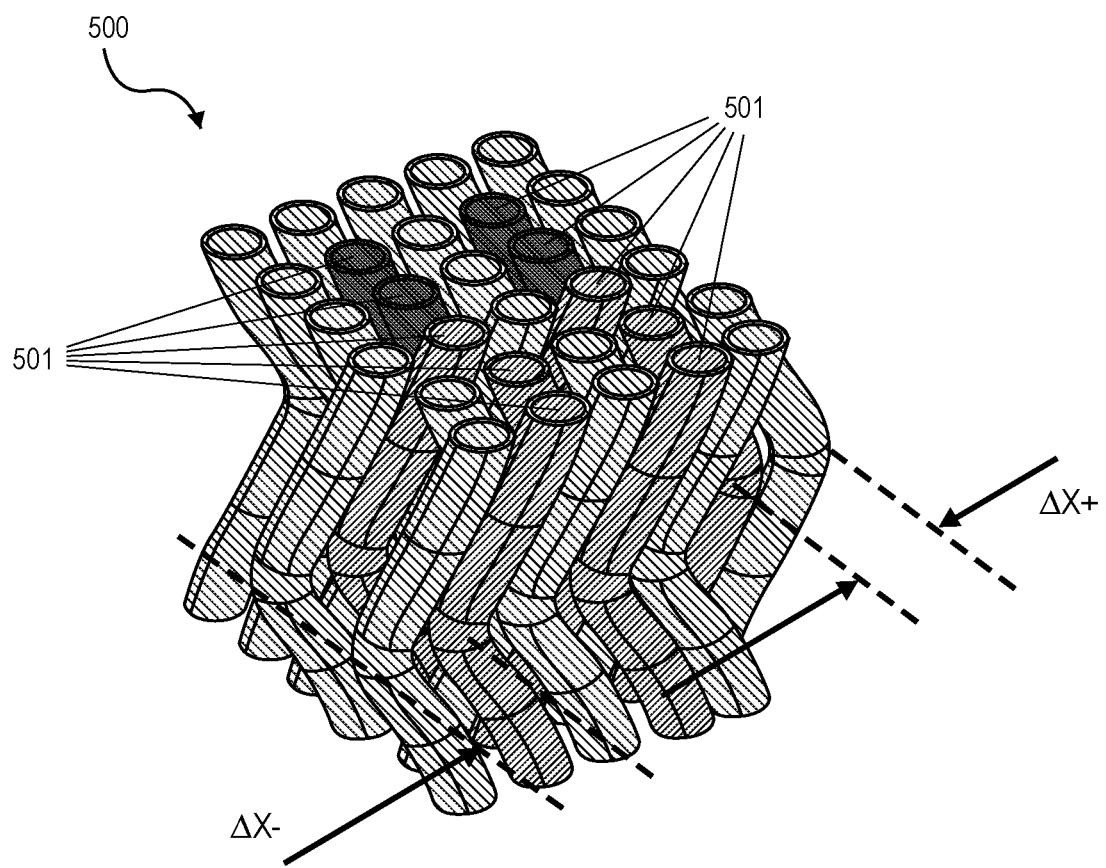
Figure 6:
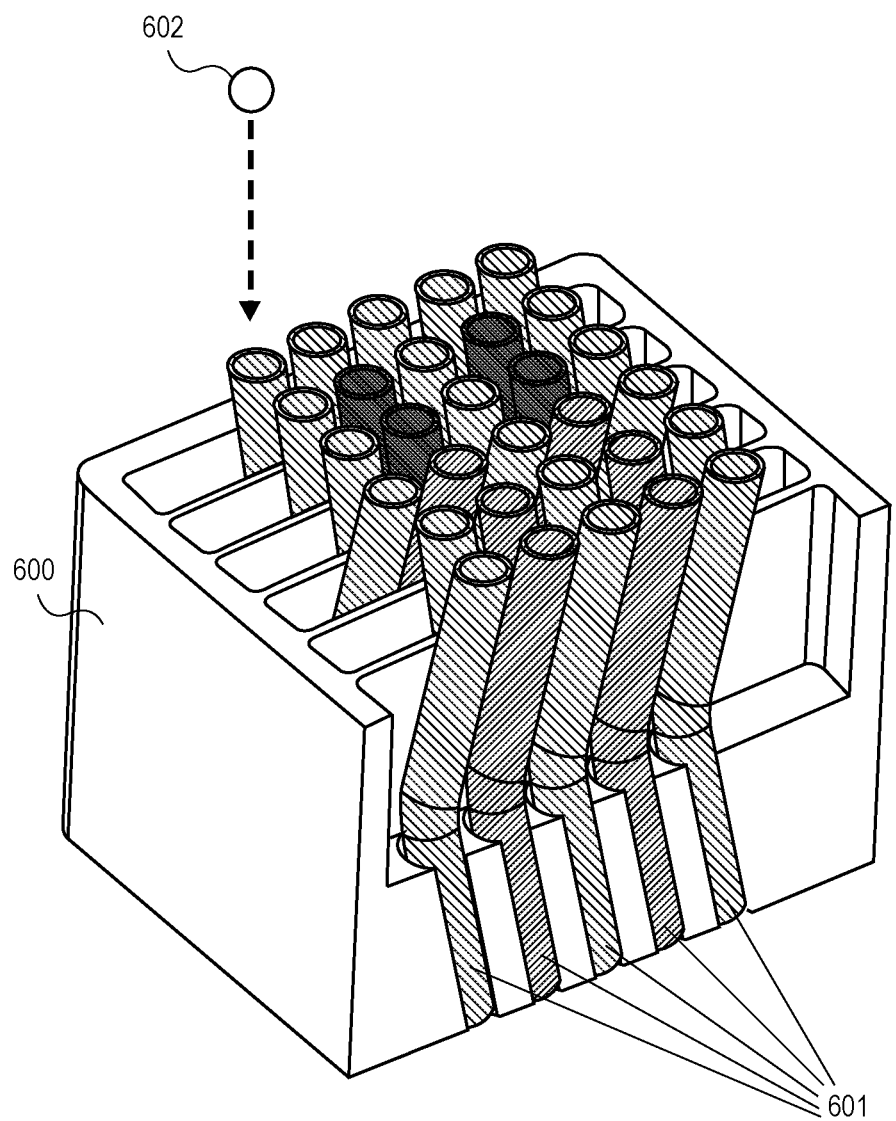
Figure 8:
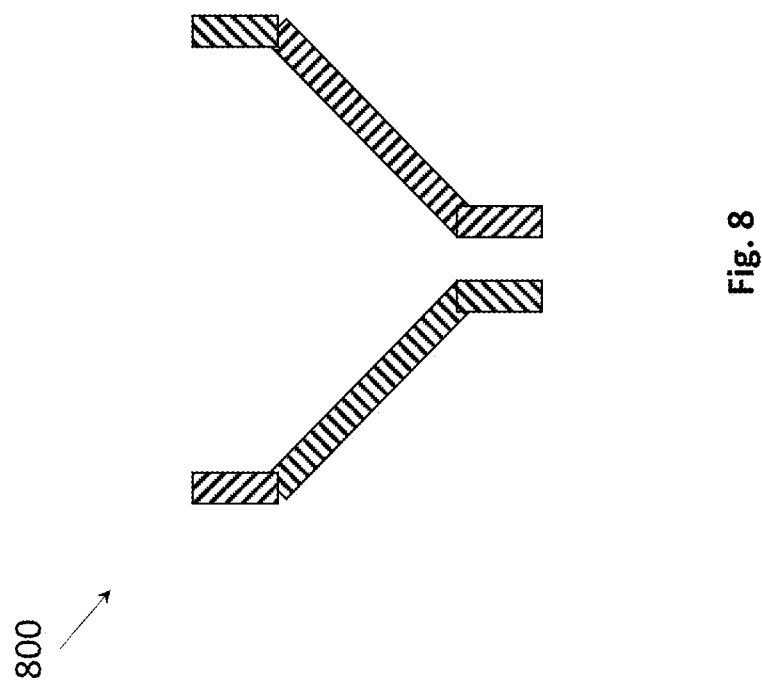
Figure 9A:
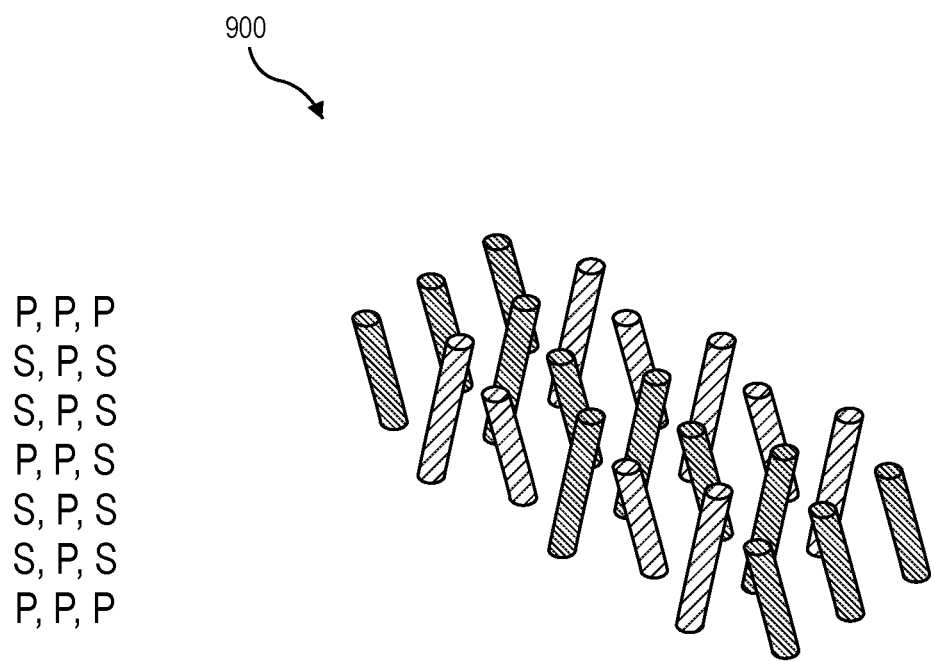
Figure 9B:
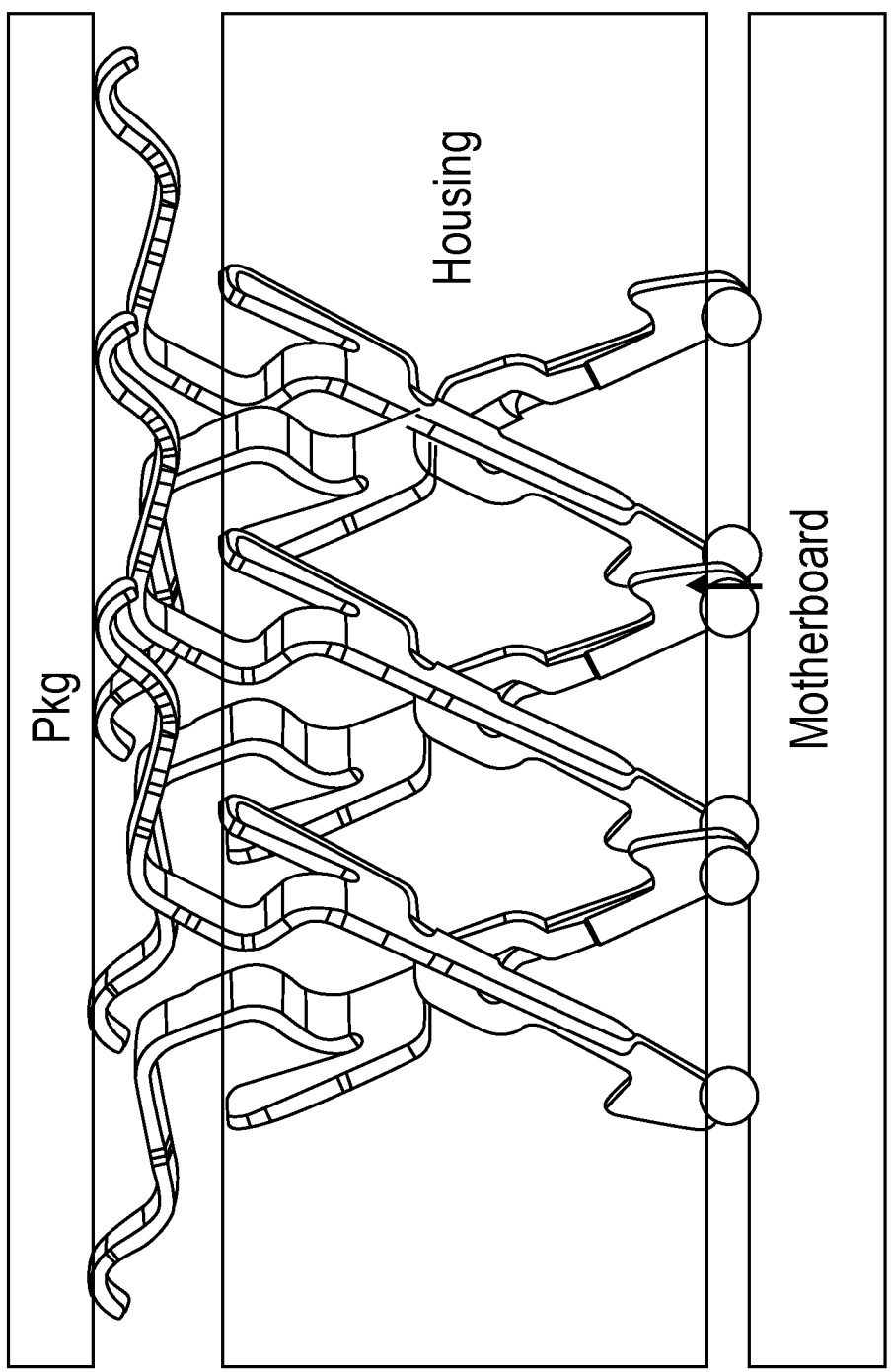
Figure 10:
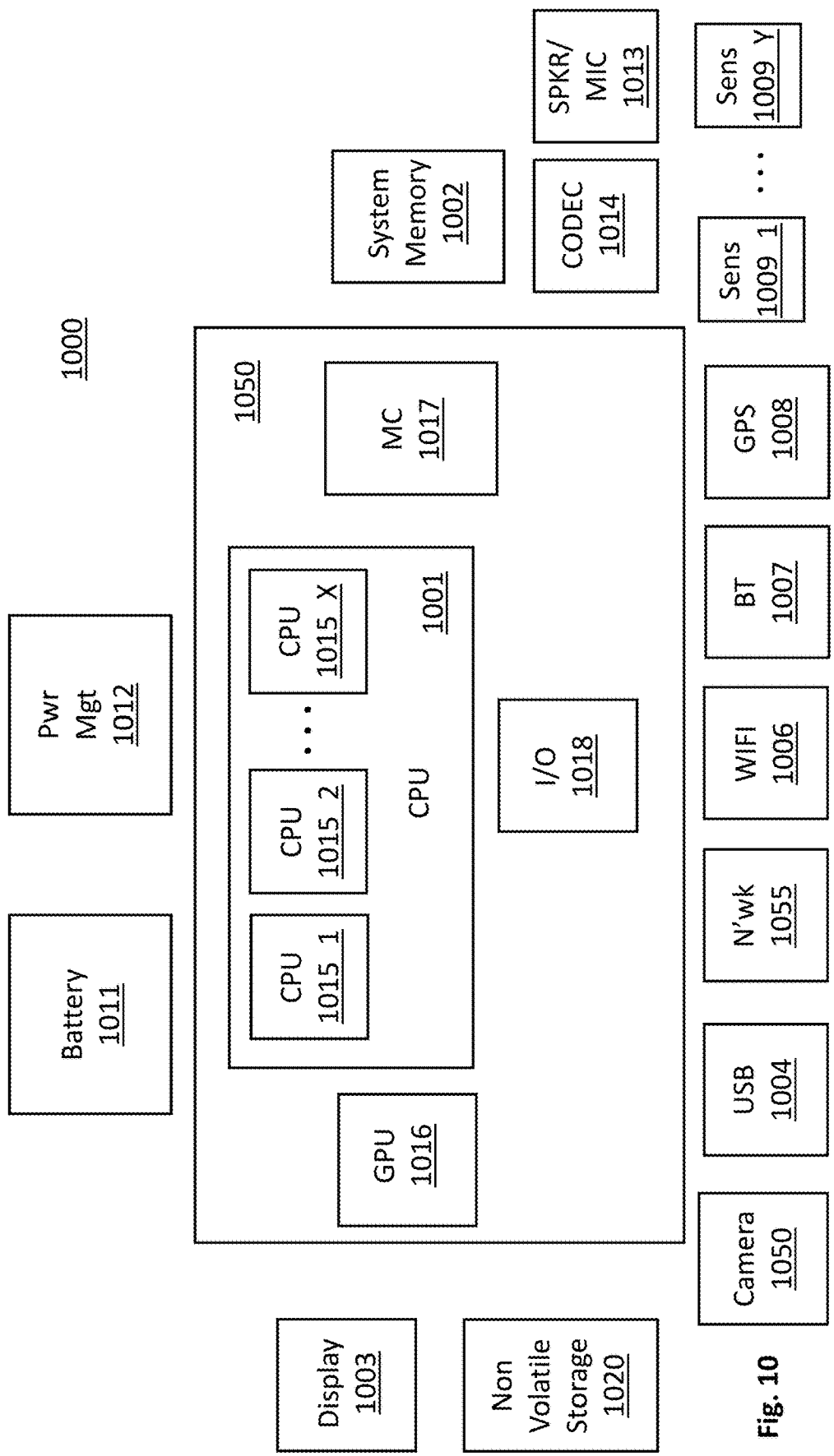

A better understanding of the present invention can be obtained from the following detailed description in conjunction with the following drawings, in which:

FIG. 1 shows a interconnect;
FIG. 2 shows a prior art packed interconnect structure;
FIG. 3 shows an improved interconnect pair;
FIG. 4 shows an improved three dimensional multiple interconnect structure;
FIG. 5 shows an improved packed interconnect structure;
FIG. 6 shows a packaged packed interconnect structure;
FIGS. 7a, 7b and 7c shows a method of making an improved packed interconnect structure;
FIG. 8 shows another improved interconnect pair;
FIGS. 9a and 9b show other improved packed interconnect structures;
FIG. 10 shows a computing system.

DETAILED DESCRIPTION

One difficulty packing large numbers of signal interconnects together and/or increasing the signal frequency of densely packed signal interconnects is the increase of induced noise amongst the signal interconnects. Here, as is understood in the art, an electronic signal is sent over a interconnect by directing a time varying electrical current through the interconnect. As the current in the interconnect changes, as observed in FIG. 1, a radial, time varying magnetic field 101 is created that circulates around the interconnect 102.

When a number of signal carrying interconnects are packed close to one another and/or the frequencies of the interconnects' time-varying currents increases, as depicted in FIG. 2, the electrical current carried by one interconnect may flow through the magnetic field created by another interconnect (such as an adjacent interconnect). Unfortunately, the presence of a time varying magnetic field in the pathway of the electrical signal is reproduced as noise in the electrical signal. Generally, the total energy of such noise limits the performance of the electrical signal. That is, with increasing noise energy, the amplitude of the signal must be increased and/or the highest frequencies of the signal must be reduced. In the case of multiple (e.g., high frequency) signal carrying interconnects that are packed tightly together, the amount of induced noise energy is readily compounded because the induced magnetic fields of many interconnects can appear in the pathway of a single interconnect. Additionally, far end cross talk noise is inversely proportional to the coupling length and distance between pins.

The amount of far end induced cross talk, however, falls rapidly with increased distance between noise coupled interconnects and reduces linearly with coupling length reduction. That is, generally, a particular interconnect will observe significantly more noise from an immediately neighboring interconnect than a more distance one. To be more precise, the intensity of the magnetic flux that is induced from a interconnect's time varying current varies as $1/r^2$ where r is the radial distance from the interconnect. A solution therefore is to keep neighboring interconnects at least some minimal distance apart. That however, by itself, defeats the original purpose of trying to pack as many interconnects together as possible.

FIG. 3 depicts a wiring solution that puts distance between neighboring interconnects 301, 302 so as to dramatically reduce the induced noise between them. The depiction of FIG. 3 can be viewed as a cross section in which the interconnects 301, 302 run vertically upward along a z axis, e.g., from a substrate 300 located at the bottoms of the interconnects that lies in the xy plane. The interconnects 301, 302 are purposely formed so that they are separated by a distance over much of their run length, where, as described immediately below, is wide enough to significantly reduce magnetic field coupling (and therefore noise) between them.

Here, both of the interconnects 301, 302 can be viewed as having respective input ends 307, 308 and respective output ends 309, 310, where, e.g., the input and output ends of a same interconnect are aligned with one another along a respective vertical axis 311, 312. At the input and output ends 307/308, 309/310, the interconnects may be separated by a minimal distance such as, e.g., the minimal pitch of the wiring's manufacturing technology.

Traversing the interconnects from their respective input ends 307/308, the interconnects deviate away from one another along first respective legs 303, 304 so as to put distance between them. Notably, in the case where the legs deviate at 90° with respect to one another, neither leg 303, 304 induces noise in the other leg. Here, as is understood in the art, the radial magnetic field from both legs 303, 304 will emanate perpendicular to their respective current flows (which follow the path of the respective legs 303, 304). At a 90° deviation angle between the legs 303, 304, the perpendicular orientation of the magnetic field from one leg does not cross into the current path of the other leg. As such, the other leg observes minimal noise from the leg.

The respective legs 303, 304 then terminate at respective elbows 313, 314. From the elbows 313, 314, second respective legs 305, 306 converge toward one another until they reach their respective output ends 309, 310. Notably, the perpendicular orientation of the magnetic fields induced from one of the second legs theoretically crosses the current flow of its oppositely located first leg (the magnetic field from second leg 305 theoretically crosses through the current flow of first leg 304 and the magnetic field from second leg 306 theoretically crosses through the current flow first leg 303). Likewise, the magnetic field induced from a first leg theoretically cross the current flow of its oppositely located second leg (the magnetic field from first leg 304 theoretically crosses through the current flow of second leg 305 and the magnetic field from first leg 303 theoretically crosses through the current flow second leg 306).

As such, oppositely located leg pairs 304/305 and 303/306 are cross-coupled and can induce noise into one another.

However, owing to the separation angle between legs and the lengths of the legs (which sets a distance 315 between elbows 313, 314), for the applicable change in current flow in either/both interconnects, both opposite leg pairs 304/305, 303/306 have enough distance between them such that the aforementioned $1/r^2$ roll-off in magnetic flux intensity from one leg of a pair results in negligible coupled magnetic flux intensity and corresponding induced noise into the other leg of the pair. As such there is negligible induced noise amongst leg pairs 304/305 and 303/306. As such, the overall structure results in minimal/negligible induced noise between the interconnects 301, 301 over their entire respective run lengths.

FIG. 4 shows a three dimensional embodiment 400 where the interconnects 401, 402, 403 are located on different y axis locations unlike FIG. 3 which suggests the interconnects 301, 302 are located on a same y axis location. Nevertheless, the principles of reduced noise coupling between neighboring interconnects in the three dimensional structure 400 of FIG. 4 are essentially the same as those described above with respect to FIG. 3. Additionally, the distance between non-neighboring interconnects (e.g., interconnect 401 and 403) in the three dimensional interconnect structure 400 of FIG. 4 is sufficient to keep induced noise negligible between non-neighboring interconnects (although additional shielding may help as described in more detail below).

FIG. 4 also depicts for comparison purposes a three dimensional depiction of three interconnects in a traditional straight line arrangement 410. Comparing both the traditional 410 and improved 400 structures, note that the improved structure 400 has a spatial cost of 2ΔX along the x axis which is comparable to the aforementioned distance 315 between elbows 313, 314 in the wiring structure of FIG. 3. That is, the improved structure 400 is approximately 2ΔX wider than the traditional structure 410. Importantly, although the outward expansion of the overall improved structure 400 results in a 2ΔX space consumption "cost" as compared to the traditional structure 410, the cost does not replicate/compound itself as more and more interconnects are added packed into the wiring structure. That is, as additional interconnects are packed into the improved structure 400 of FIG. 4, the structure remains approximately only 2ΔX wider than a structure that packs a same number of additional straight line interconnects into the traditional structure 410. The improved structure 400 also includes reduced coupling path length as compared to the traditional structure 410 because of its alternately angled pins and therefore exhibits less cross talk noise.

FIG. 5 depicts this property. As can be seen in FIG. 5, which shows a 5×6 array of interconnects that are shaped according to the improved approach, the overall structure remains approximately only 2ΔX wider than if the 5×6 array were packed with straight interconnects. As such, the spatial cost approximately varies as 2ΔX/N where N is the number of interconnects packed into the structure 500. Thus, with increasing numbers of interconnects that are packed into the structure 500 (increasing N), the spatial cost itself becomes negligible.

As such, a high density interconnect packing structure with negligible induced noise amongst the interconnects is realized. In the particular embodiment 500 of FIG. 5, interconnects that carry signals correspond to interconnects 501 while the remaining interconnects correspond to ground or power plane interconnects. As is known in the art, ground and power plane interconnects act to terminate magnetic flux lines which has the effect of shielding a interconnect from a noise inducing interconnect where the shielding interconnect resides between the two.

FIG. 6 shows a package structure 600 that keeps the packed interconnect structure 500 in place. As observed in FIG. 6, the package structure 600 in made of electrically insulating material (e.g., plastic, ceramic, dielectric, etc.) and includes angled slots 601 in its base to keep the interconnects in the correct location given their angled lower legs (e.g., the angle of an angled slot equals the angle of deviation of its interconnect's lower leg). With a deep enough slot (e.g., equal to the length of the interconnects' lower leg), the package structure is able to keep a interconnect in its correct location. To secure a interconnect in a slot the interconnect may be epoxied to the sidewalls of the slot or simply press fit (push through hole) where, e.g., the interconnect diameter is approximately equal to the diameter of the slot opening (more generally, the size and shape of the interconnect cross section is approximately the same size and shape as the slot opening).

Additionally, the top of each interconnect as observed in FIG. 6, is "dimpled" so that, e.g., a solder ball or micro-ball or other spherical connection 602 can easily make an electrical connection to the interconnect. As such, the packaged wiring structure can easily mate to a ball grid array. The bottoms of each of the interconnects may also be dimpled so that the packaged wiring structure can easily form an electrical and mechanical interface between two ball-grid arrays. Alternatively, the bottoms of the interconnects (and/or the tops of the interconnects) may be non-dimpled (flat) for easing mating with a pad grid array or land grid array. In the case of land grid array or pad grid array interfaces, the interconnects may be further bent or otherwise formed into a J lead or other lead shape that adds some mechanical/spring-like resistance to being pressed so as to form a secure electron-mechanical connection.

As such, the packaged structure of FIG. 6 lends itself to various types of connections such as: a chip to chip connection, a packaged chip to packaged chip connection, a chip to packaged chip connection, a chip to PC board connection, a packaged chip to PC board connection, etc. In a family of embodiments, an angled wiring approach is used to implement a high speed memory interface such as a double data rate (DDR) memory interface as specified by an industry standard such as a Joint Electron Device Engineering Council (JEDEC) industry standard. Here, the signal interconnects may correspond to high speed signal interconnects such as DQ interconnects or control/address (CA) interconnects. The angled interconnects may form a connection between, e.g., stacked memory chips in a stacked memory chip structure, a logic chip and a stack of memory chips in a stacked memory chip solution, a memory chip and a dual in-line memory module (DIMM), a stacked memory chip solution package and a PC board (motherboard), a DIMM and a PC board, etc.

Notably, unlike the embodiment of FIG. 3, the embodiments of FIGS. 4, 5 and 6 do not depict a 90° divergence angle between bottom leg pairs of neighboring interconnects and top leg pairs of neighboring interconnects. Rather, the divergence angle is closer to 60°. As such, there exists some magnetic flux coupling between bottom leg pairs of neighboring interconnects and top leg pairs of neighboring interconnects. Nevertheless, with maximum coupling existing when neighboring interconnects have 0° divergence angle (parallel), a 60° divergence angle is close enough to 90° such that any magnetic coupling between bottom leg pairs and top leg pairs is negligible. Likewise, any resulting induced noise between bottom leg pairs and top leg pairs is negligible.

Moreover, such coupling is additionally shielded in the embodiments of FIGS. 5 and 6 by the presence of shielding interconnects between signal interconnects.

In an embodiment, a divergence angle less than 90° as between neighboring bottom/top leg pairs is utilized to ease the manufacturing process of the packaged interconnect structure. FIGS. 7a through 7c depict one embodiment of manufacturing process for forming the packaged wiring structure of FIG. 6. As observed in FIG. 7a, a bottom fixture 701 having angled slots is first presented. In an embodiment, the bottom fixture 701 may be the base of the final packaged structure.

As observed in FIG. 7b, straight interconnects (e.g., pins) 702 are then inserted in corresponding slots of the bottom fixture 701 which results in straight pins 702 that emerge from a top face of the bottom structure 701 at the angle of the bottom fixture's slots. The pins 703 are then bent, as observed in FIG. 7c, by applying a force 703 to the pins 702 in unison in the direction the pins are to be bent. In an embodiment, an upper structure (not shown) that is similar in structure to the bottom fixture 701 is placed only over the upper regions of the exposed pins so that the tops of the pins extend only a shallow distance into the upper structure's slots. The upper structure is then pushed or pulled in the direction that the pins are to be bent. The shallow insertion of the tops of the pins into the upper structure is not only enough to grab the tops of the pins but also applies maximum torque to the elbow/bending region of the pins. As such, the pins should easily bend in unison in the desired direction a same amount.

The process of FIGS. 7a-7c is suitable for forming a single row of angled interconnects in the packed interconnect structure of FIGS. 4, 5 and 6. A next row (e.g., positioned deeper along the y axis of the packed structure) is formed by the same process of FIGS. 7a through 7c except that the interconnects are initially angled in the opposite direction of FIG. 7b and then bent in the opposite direction of FIG. 7c. Alternatively, the identical process of FIGS. 7a through 7c is performed except that the right and left ends of the finished structure of FIG. 7c are swapped before placement into the final packaged structure.

FIG. 8 shows another embodiment 800 that only includes bottom diverging legs. Here, for the same reasons described above with respect to FIG. 3, depending on divergence angle, little or no magnetic flux coupling should exist between the diverging interconnect legs. As a consequence, one leg should induce little or no noise in the other leg.

FIG. 9a shows a three dimensional embodiment 900 of the approach of FIG. 8. Here, shielding pins (P) are dispersed to promote shielding and minimize cross-coupling between signal pins (S) where possible. Notably, in the particular pattern depicted in FIG. 9, some neighboring pins will exhibit cross-coupling approximately at their midsections. However, such cross-coupling is largely limited to their mid-sections rather than their entire run lengths which, in turn, effectively minimizes the cross-coupling and resulting induced noise between them.

Note that singularly divergent interconnect approach may be more feasible in monolithic implementations in the metallurgical layers of a semiconductor chip, where, e.g., the angled slots are formed in the inter metal layer dielectric between metal layers with an anisotropic etch that etches one or more dielectric layers at the angle of divergence. Metal is then deposited in the angled opening to form the angled interconnects.

FIG. 9b shows another bottom angled approach in which the interconnects have bent leads to form a compressive/spring-like resistance with upper pads to form a secure electro-mechanical connection.

In any of the embodiments described above it should be understood that a wide variety of divergence angles are possible (e.g., within a range of 90° to 20°).

This approach can be applied to the packaging via design.

FIG. 10 provides an exemplary depiction of a computing system 1000 (e.g., a smartphone, a tablet computer, a laptop computer, a desktop computer, a server computer, etc.). As observed in FIG. 10, the basic computing system 1000 may include a central processing unit 1001 (which may include, e.g., a plurality of general purpose processing cores 1015_1 through 1015_X) and a main memory controller 1017 disposed on a multi-core processor or applications processor, system memory 1002, a display 1003 (e.g., touchscreen, flat-panel), a local interconnectd point-to-point link (e.g., USB) interface 1004, various network I/O functions 1005 (such as an Ethernet interface and/or cellular modem subsystem), a interconnectless local area network (e.g., WiFi) interface 1006, a interconnectless point-to-point link (e.g., Bluetooth) interface 1007 and a Global Positioning System interface 1008, various sensors 1009_1 through 1009_Y, one or more cameras 1010, a battery 1011, a power management control unit 1012, a speaker and microphone 1013 and an audio coder/decoder 1014.

An applications processor or multi-core processor 1050 may include one or more general purpose processing cores 1015 within its CPU 1001, one or more graphical processing units 1016, a memory management function 1017 (e.g., a memory controller) and an I/O control function 1018. The general purpose processing cores 1015 typically execute the operating system and application software of the computing system. The graphics processing unit 1016 typically executes graphics intensive functions to, e.g., generate graphics information that is presented on the display 1003. The memory control function 1017 interfaces with the system memory 1002 to write/read data to/from system memory 1002. The power management control unit 1012 generally controls the power consumption of the system 1000.

Each of the touchscreen display 1003, the communication interfaces 1004-507, the GPS interface 1008, the sensors 1009, the camera(s) 1010, and the speaker/microphone codec 1013, 1014 all can be viewed as various forms of I/O (input and/or output) relative to the overall computing system including, where appropriate, an integrated peripheral device as well (e.g., the one or more cameras 1010). Depending on implementation, various ones of these I/O components may be integrated on the applications processor/multi-core processor 1050 or may be located off the die or outside the package of the applications processor/multi-core processor 1050. The computing system also includes non-volatile storage 1020 which may be the mass storage component of the system.

Computing system may contain various embodiments of angled interconnect connections as described at length above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hard interconnectd logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed:

1. An apparatus, comprising:
an electro-mechanical interface comprising angled signal interconnects, wherein, the angling of the signal interconnects is to reduce noise coupling between the angled signal interconnects, wherein the angled signal interconnects comprise diverging lower legs and converging upper legs, and wherein the angled signal interconnects correspond to different electrical nodes, wherein the electro-mechanical interface further comprises angled shielding interconnects between the angled signal interconnects.

2. The apparatus of claim 1 wherein the angled shielding interconnects have the same angling as the angled signal interconnects.

3. The apparatus of claim 1 wherein the angled shielding interconnects comprise diverging lower legs and converging upper legs.

4. The apparatus of claim 1 wherein at least one end of the angled signal interconnects is dimpled to mate to a solder ball.

5. The apparatus of claim 1 wherein at least one end of the angled signal interconnects is flat to mate to at least one of a land grid array and pad grid array.

6. The apparatus of claim 1 wherein the angled signal interconnects diverge from one another at an angle within a range of 90° to 20°.

7. A computer system, comprising:
a plurality of processing cores;
a main memory;
a memory controller between the plurality of processing cores and the main memory; and,
an electro-mechanical interface comprising angled signal interconnects, wherein, the angling of the signal interconnects is to reduce noise coupling between the angled signal interconnects, wherein the angled signal interconnects comprise diverging lower legs and converging upper legs, and wherein the angled signal interconnects correspond to different electrical nodes.

8. The computer system of claim 7 wherein the electro-mechanical interface is between a packaged semiconductor chip and a motherboard.

9. The computer system of claim 8 wherein the electro-mechanical interface couples a stacked memory chip solution to the motherboard.

10. The computer system of claim 7 wherein the angled signal interconnects transport data signals of the main memory.

11. The computer system of claim 7 wherein the electro-mechanical interface is between two stacked semiconductor chips.

12. The computer system of claim 7 wherein the electro-mechanical interface is between two packaged semiconductor chips.

13. The computer system of claim 7 wherein the electro-mechanical interface is between a semiconductor chip and a packaged semiconductor chip.

14. The computer system of claim 7 wherein the electro-mechanical interface is between planar boards of the computer system.

* * * * *